(12) United States Patent
Chuang et al.

(10) Patent No.: US 8,394,156 B2
(45) Date of Patent: Mar. 12, 2013

(54) ULTRA-PURE AIR SYSTEM FOR NANO WAFER ENVIRONMENT

(75) Inventors: Tzu-Sou Chuang, HsinChu (TW); James Jeng-Jyi Hwang, Chu-Tong Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1351 days.

(21) Appl. No.: 12/112,385

(22) Filed: Apr. 30, 2008

(65) Prior Publication Data
US 2009/0275278 A1    Nov. 5, 2009

(51) Int. Cl.
   *B01D 46/00*    (2006.01)
(52) U.S. Cl. ............... 55/385.2; 55/DIG. 18; 454/187
(58) Field of Classification Search ............ 55/385.2, 55/471, 472, 473, DIG. 18, 467; 95/10, 273; 96/132, 138, 142; 454/187, 230, 232, 237, 454/246, 248
See application file for complete search history.

(56) References Cited

U.S. PATENT DOCUMENTS

| | | | | |
|---|---|---|---|---|
| 4,164,901 | A | * | 8/1979 | Everett .......................... 454/228 |
| 4,726,824 | A | * | 2/1988 | Staten ............................ 96/417 |
| 5,004,483 | A | * | 4/1991 | Eller et al. ...................... 95/10 |
| 5,890,367 | A | | 4/1999 | You et al. |
| 6,102,977 | A | * | 8/2000 | Johnson ...................... 55/385.2 |
| 6,123,617 | A | | 9/2000 | Johnson |
| 6,884,639 | B2 | | 4/2005 | Dougan et al. |
| 7,105,037 | B2 | * | 9/2006 | Olander et al. ............... 55/385.2 |
| 7,468,084 | B2 | * | 12/2008 | Bauer et al. ................... 55/385.2 |
| 7,591,867 | B2 | * | 9/2009 | Choi et al. .................... 55/385.2 |
| 2005/0115213 | A1 | * | 6/2005 | Lim et al. ..................... 55/385.2 |
| 2005/0132677 | A1 | * | 6/2005 | Bauer et al. ................... 55/385.2 |
| 2005/0160706 | A1 | * | 7/2005 | Kim et al. ..................... 55/385.2 |
| 2006/0174596 | A1 | * | 8/2006 | Choi et al. ....................... 55/467 |
| 2007/0062167 | A1 | * | 3/2007 | Olander et al. ............... 55/385.2 |
| 2008/0182429 | A1 | * | 7/2008 | Mizuno et al. ................ 438/787 |
| 2010/0112926 | A1 | * | 5/2010 | Ozeki ............................ 454/187 |
| 2011/0179949 | A1 | * | 7/2011 | Hauville ......................... 95/273 |

FOREIGN PATENT DOCUMENTS

| | | |
|---|---|---|
| TW | 482881 | 3/1986 |
| TW | 338095 | 8/1998 |

OTHER PUBLICATIONS

Official Action issued in counterpart Taiwan application.

* cited by examiner

*Primary Examiner* — Duane Smith
*Assistant Examiner* — Minh-Chau Pham
(74) *Attorney, Agent, or Firm* — Duane Morris LLP

(57) ABSTRACT

In one embodiment, an air filtration system includes a first ventilation path connected between at least one external air supply and a clean room. The first ventilation path is configured to direct air from the at least one external air supply to the clean room. A second ventilation path is connected to the clean room. The second ventilation path is configured to recirculate air in the clean room. A third ventilation path, separate from the first path, is connected between the at least one external air supply and a tool environment disposed within the clean room. The third ventilation path includes an ultra-pure air filtration unit disposed between the outdoor air supply and the tool environment. The ultra-pure air filtration unit includes a compressor and a dryer.

21 Claims, 3 Drawing Sheets

| Contaminants | Outside Air | After Compressor | After Dryer | After Filter |
|---|---|---|---|---|
| | | | | Unit: ppbv |
| F⁻ | <0.012 | <0.012 | Nill | <0.012 |
| Cl⁻ | 0.188 | 0.090 | Nill | 0.013 |
| $NO_3^-$ | 0.247 | 0.678 | Nill | <0.016 |
| $PO_4^{3-}$ | <0.024 | <0.024 | Nill | <0.024 |
| $SO_4^{2-}$ | 0.242 | <0.012 | Nill | <0.012 |
| $NH_4^+$ | 12.40 | 8.31 | 0.300 | 0.060 |
| Toluene | 401.9 | 426.3 | 74.3 | 4.4 |
| Ethane | 265.5 | 275.4 | 98.6 | 14.3 |
| Ethyl Acetate | 136.4 | 126.8 | 15.3 | <0.5 |
| Cyclohexanone | 92.3 | 126.1 | 53.0 | 6.8 |
| m/p - Xylene | 35.0 | 36.5 | 10.4 | 4.9 |
| o - Xylene | 14.1 | 14.0 | 3.3 | 1.8 |
| Acetone | 20.3 | 25.6 | 10.8 | 0.9 |
| Ethylbenzene | 14.1 | 14.6 | 3.9 | 1.5 |

FIG. 3

ULTRA-PURE AIR SYSTEM FOR NANO WAFER ENVIRONMENT

FIELD OF THE DISCLOSURE

The disclosure relates to a semiconductor wafer fabrication environment, and more specifically, to the control of airborne molecular contamination (AMC) in a semiconductor wafer fabrication environment.

BACKGROUND

Semiconductor wafer processing requires an environment virtually free from AMC and particulate matter so the wafers may be processed without being contaminated. Accordingly, semiconductor processing is performed in clean rooms in which air is highly purified or filtered prior to its introduction into the room. Chemical filters as well as high efficiency particulate air (HEPA) and/or ultra low penetration air (ULPA) filters are commonly employed to filter and purify the air prior to its introduction into the clean room. As wafer processing enters into nano technology, more and more chemical filters are required to meet the tight AMC specification requirements for wafer processing.

FIG. 1 is a block diagram of the air flow in a conventional air filtration system 100 for a clean room. As shown in FIG. 1, the conventional air filtration system 100 introduces air into the clean room 114 in two ways: (1) through a make-up air flow 102 and (2) through a recirculation airflow 122. The make-up airflow 102 takes air from an external (e.g., outdoor) air supply 104 and passes it through a make-up air treatment unit (ATU) 106. In the ATU 106, the outdoor air undergoes airborne molecular contamination (AMC) removal treatment by passing through one or more chemical filters. After passing through ATU 106, the make-up airflow 102 is mixed with air from the recirculation flow 122. The combined airflow is cooled through dry cooling coil 108.

The combined airflow, which includes the filtered outdoor air and the recirculated air, is passed through a fan filter unit (FFU) 110 where it is once again filtered by one or more chemical filters. The combined air is then blown by the fan of the FFU 110 into the clean room 114. A fan mounted on the tool directs air from the clean room 114 into the tool environment 112. A portion of the air that passes through the tool environment 112 is dispersed back into the clean room 114 where it mixes with the air in the clean room 114. The mixed air flows into a sub-fabrication air return area 116. At the sub-fabrication air return area 116, part of the returned air will be discharged to the outdoors, along with some air drawn directly from the tool environment 112, after passing through the air abatement system 118. The remaining portion of the airflow will be recirculated and mixed with the make-up flow 102 from the outdoors at the dry cooling coil 108. The conventional air purification systems as described above are expensive as they require a large quantity of expensive chemical filters to purify both the make-up airflow 102 and the recirculation airflow 122. Additionally, the conventional systems suffer from cross-contamination between the clean room and the tool environment caused by turbulent air in the clean room 114.

Accordingly, an improved air filtration system for nano-wafer environments is desired.

SUMMARY OF THE DISCLOSURE

In one embodiment, an air filtration system comprises a first ventilation path connected between at least one external air supply and a clean room. The first ventilation path is configured to direct air from the at least one external air supply to the clean room. A second ventilation path is connected to the clean room. The second ventilation path is configured to recirculate air in the clean room. A third ventilation path, separate from the first path, is connected between the at least one external air supply and a tool environment disposed within the clean room. The third ventilation path includes an ultra-pure air filtration unit disposed between the outdoor air supply and the tool environment. The ultra-pure air filtration unit includes a compressor and a dryer.

In another embodiment, a method comprises the steps of filtering a first make-up airflow, purifying a second make-up airflow in an ultra-pure air purification unit, combining the first make-up airflow with a first recirculation airflow, and applying the second make-up airflow directly into a tool environment and the combined airflow into a clean room. The ultra-pure air purification unit includes an air compressor and dryer.

In another embodiment, a method for purifying air for a nano-technology process environment comprises the steps of providing air from an external air supply, pre-treating the air at a pre-treatment unit, compressing the air to a pressure such that water vapor and airborne contaminants form a condensate, removing the condensate from the air, post-treating the air at a post-treatment unit, and directing the air into a tool environment within a clean room. The air is directed into the tool room while bypassing an air recirculation path of the clean room.

BRIEF DESCRIPTION OF THE DRAWINGS

FIG. 3 is a chart of clean, dry air measurements taken at various stages of the ultra-pure air treatment unit in accordance with the embodiment shown in FIG. 2.

DETAILED DESCRIPTION

Figure 1:
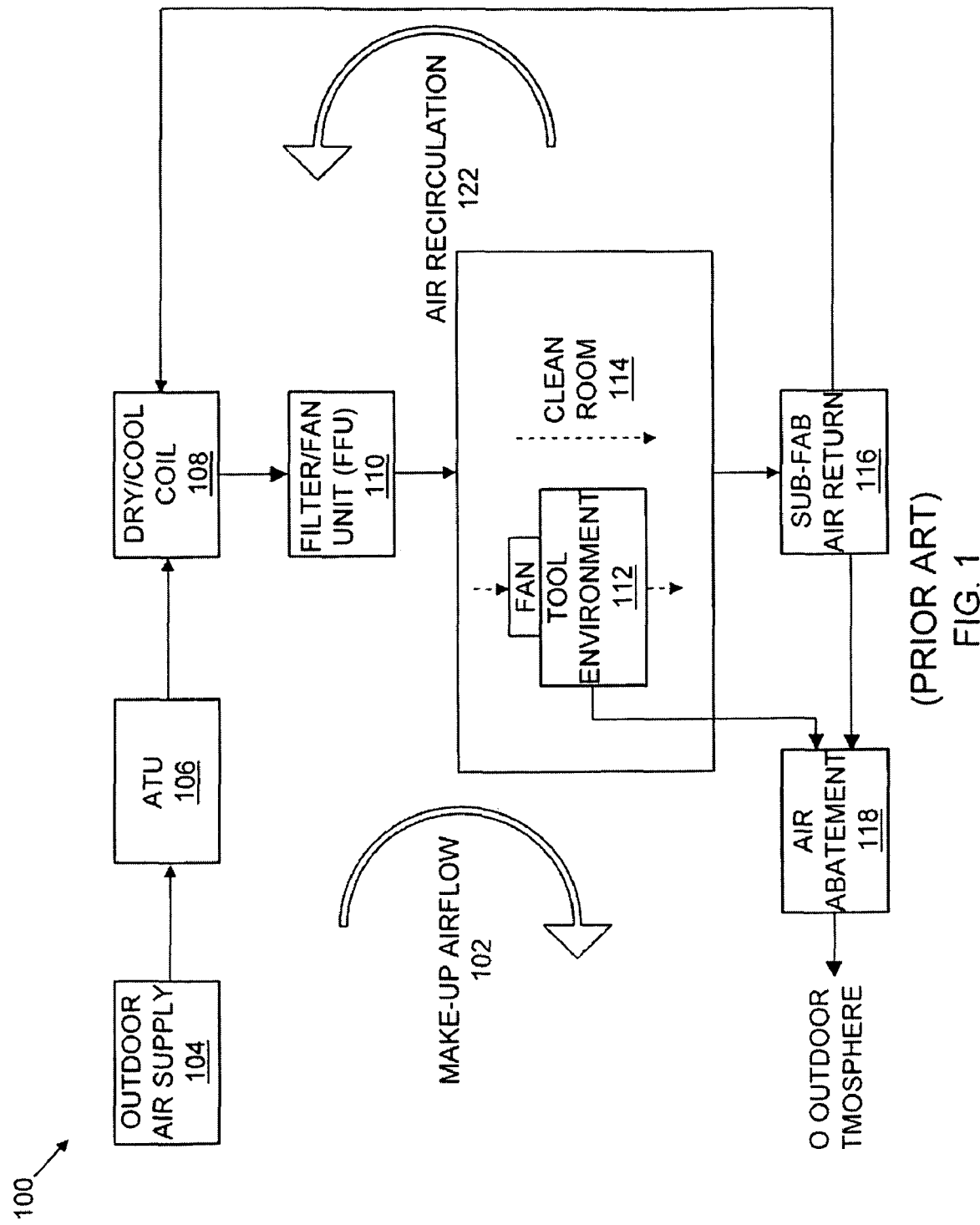
FIG. 1 is a block diagram of the airflow cycle of a conventional semiconductor fabrication facility.
Figure 2:
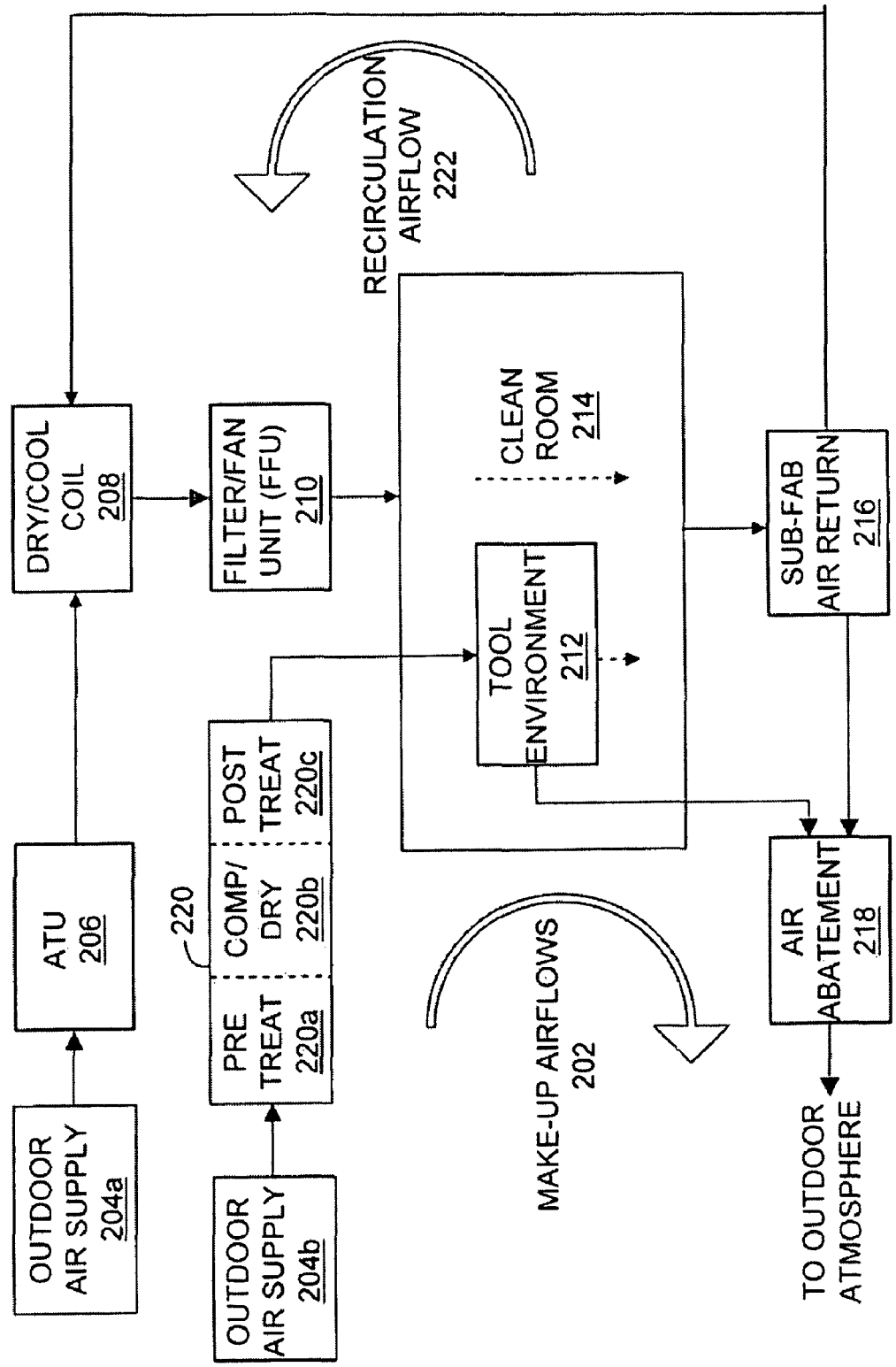
FIG. 2 is a block diagram of one embodiment of an improved airflow cycle of a semiconductor fabrication facility.

FIG. 2 is a flow diagram of one embodiment of a clean room air filtration system. The clean room 214 may be a Class 100 clean room, e.g., the air in the clean room 214 contains fewer than 100 particles that are 0.5 µm or larger per cubic foot of air. Note that in other embodiments clean room 214 may be a classification other than Class 100, or clean room 214 may be another room type such as, for example, a nano-technology lab or any room where ultra-pure air is used. As illustrated in FIG. 2, the clean room air filtration system includes two airflows: (1) a make-up airflow 202 and (2) an air recirculation flow 222. Each airflow 202, 222 is directed through a separate ventilation path until it is received in the clean room 214 and tool environment 212. Make-up airflow 202 includes a dedicated airflow for the clean room 214 and a separate dedicated airflow for the tool environment 212 where tooling is in direct contact with semiconductor wafers.

The make-up airflow for the clean room 214 is received from an external (e.g., outdoor) air supply 204a, which passes through air treatment unit (ATU) 206. Although the example of FIG. 2 uses outdoor air for the external air supplies 204a and 204b, other embodiments may use a different external air source, such as air from a compressed air storage reservoir, or air from a central ventilation system.

In the ATU 206, the air received from the external air supply 204a undergoes temperature and humidity control through HVAC coils and one or more humidifiers. ATU 206 may also include a pre-filter, a medium filter, and a high efficiency particulate air (HEPA) filters to remove particles contaminants from the air. Once the air is filtered, it is combined with air from the recirculation airflow 222 at a dry cooling coil 208, where the air is cooled. The recirculation airflow 222 is directed through a ventilation path that is separate from the paths of the make-up airflows 202, and continuously recirculates air from below the clean room 214 and tool environment 212 to be recombined with air from make-up airflow 202 for the clean room 214. The combined dry cooled air passes through the fan and filter unit (FFU) 210 where it is once again filtered prior to being directed into the clean room 214 by one or more fans.

The make-up airflow 202 for the tool environment 212 is a directed along a separate ventilation path between an external air supply 204b and the tool environment 212. Accordingly, the make-up airflow for the tool room 212 is filtered separately from the air that is directed into the clean room 214. The dedicated airflow for the tool environment 212 is received from external air supply 204b and undergoes ultra-pure air (UPA) treatment at UPA treatment unit 220. In some embodiments, external air supplies 204a and 204b are separate and distinct from each other. In other embodiments, external air supplies 204a and 204b may be the same external air supply, connected via two separate and distinct ventilation paths for providing the air to ATU 206 and UPA treatment unit 220, respectively.

In one embodiment, UPA treatment unit 220 includes a pre-treatment unit 220a, an air compressor and dryer unit 220b, and a post-treatment unit 220c. Pre-treatment unit 202a may include an ionizer and a photo-catalyst. Additionally, a humidifying component may be included in the pre-treatment unit 220a to enhance the performance of the compressor and dryer unit 220b.

Air from the pre-treatment unit 220a is received at the compressor and dryer unit 220b. The compressor may be an industrial air compressor that increases the pressure of the air in the compressor to a pressure above that of the external atmosphere until water vapor and airborne contaminants are condensed into a liquid condensate. The air contaminants are dissolved in the pressurized water vapor and removed through a drain located in UPA treatment unit 220. The compressed air is dried in a dryer, which also enhances the purity of the air. The dryer may be an industrial compressed air dryer configured to remove additional condensate and airborne contaminants from the air. In some embodiments, the dryer may be a refrigerated air dryer which further reduces the dew point of the compressed air to remove airborne contaminants.

The compressed and dried air may then enter a post-treatment unit 220c. Post-treatment unit 220c may include one or more chemical and/or physical filters, e.g., HEPA, ultra-low penetration air (ULPA) filter, and the like, to further purify the air. The air from the post-treatment unit 220c is then directed into the tool environment 212 where it may be applied directly to the tooling or another point of use.

FIG. 3 illustrates one example of a clean, dry air (CDA) measurement of the air through various stages of the ultra-purification treatment in accordance with the embodiment shown in FIG. 2. As shown in FIG. 3, the UPA treatment unit 220 reduces the amount of contaminants including, but not limited to, fluoride, chloride, nitrate, phosphorus, sulfate, and ammonium from the external air. The compressor purification also reduces the amount of organic contaminates in the air, such as, for example, toluene, ethane, ethyl acetate, cyclohexanone, xylene, acetone, and ethlybenzene. To increase the purity of the air, the UPA treatment unit 220 may also incorporate additional air purification techniques to reduce AMCs, such as, for example, air-washers, chemical filters, photo-catalyst filters, and ultra-violet radiation at the pre-treatment unit 220a and/or post-treatment unit 220c.

By isolating the make-up airflows 202 for the tool environment 212 and the clean room 214, the chance of contamination of the tool environment 212 by locally borne contaminants caused by turbulent airflow in the clean room 214 is reduced. Additionally, separating the make-up airflow for the clean room 214 reduces the amount of air that requires ultra-pure air treatment. Purifying with the UPA treatment unit 220 reduces the number of chemical filters that may be installed in the FFU 210 to filter the air for the clean room 214. Reducing the number of chemical filters through which the air passes reduces the likelihood of experiencing an undesired pressure drop in the clean room 214, which may occur when multiple chemical filters are used to purify an airflow in conventional clean room air filtration systems.

As shown in FIG. 2, the air from the clean room 214 and tool environment 212 get mixed in clean room 214 and flow into the sub-fabrication air return area 216. A portion of the air received in the sub-fabrication air return area 216 is diverted back into the clean room 214 as part of the recirculation airflow 222. The remainder of the air received in the sub-fabrication air return area 216, along with some of the air directly removed from the tool environment 212, is removed through the air abatement system 218, which discharges the air to the outdoors.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An air filtration system, comprising:
   a first ventilation path connected between at least one external air supply and a clean room, the first ventilation path configured to direct air from the at least one external air supply to the clean room;
   a second ventilation path connected to the clean room, the second ventilation path configured to recirculate air in the clean room; and
   a third ventilation path separate from the first path and connected between the at least one external air supply and a tool environment disposed within the clean room, the third ventilation path including an ultra-pure air filtration unit disposed between the external air supply and the tool environment, the ultra-pure air filtration unit including a compressor and a dryer.

2. The air filtration system of claim 1, wherein the compressor and dryer are configured to reduce airborne contaminates by pressurizing the air and drying the air.

3. The air filtration system of claim 1, wherein the ultra-pure air filtration unit includes a pre-treatment unit having a humidifier, the humidifier configured to increase the efficiency of the compressor and dryer.

4. The air filtration system of claim 3, wherein the ultra-pure air filtration unit further includes a post-treatment unit, the post treatment unit including a one or more chemical filters.

5. The air filtration system of claim 1, wherein the first ventilation path further includes one or more high efficiency particulate air (HEPA) filters disposed between the at least one external air supply and the clean room.

6. The air filtration system of claim 1, wherein the compressor is configured to compress the air such that the water vapor in the air condenses to a liquid form.

7. The air filtration system of claim 6, wherein the compressor includes a drain configured to remove the condensed liquid from the compressor.

8. A method, comprising the steps of:
filtering a first make-up airflow that is directed along a first ventilation path;
purifying a second make-up airflow in an ultra-pure air purification unit, the ultra-pure air purification unit including an air compressor and dryer that are disposed along a second ventilation path that is separate from the first ventilation path along its entire length;
combining the first make-up airflow with a first recirculation airflow that is directed along a third ventilation path that is separate from the first and second ventilation paths; and
applying the second make-up airflow directly into a tool environment containing a tool and the combined airflow into a clean room.

9. The method of claim 8, further comprising the step of:
filtering the combined airflow prior to applying it into the clean room.

10. The method of claim 8, wherein purifying the second make-up airflow comprises the steps of:
compressing the air in the compressor to change water vapor into a condensate, the condensate including air contamination particles;
removing the condensate from the compressor; and
drying the air to reduce the residual water content.

11. The method of claim 9, further comprising the step of:
creating the first recirculation airflow using a portion of the combined airflow and the second make-up airflow.

12. The method of claim 11, further comprising the step of:
directing a second portion of the combined airflow and the second make-up airflow to an external environment.

13. The method of claim 9, further comprising the step of:
cooling and drying the combined airflow prior to filtering.

14. The method of claim 9, wherein purifying the second make-up airflow further includes:
pre-treating the second make-up airflow prior to compressing and drying the air, wherein pre-treating includes:
ionizing the air; and
humidifying the air to enhance the efficiency of the compressor.

15. The method of claim 14, wherein purifying the second make-up airflow further includes:
post-treating the second make-up airflow after compressing and drying the air, wherein post-treating includes:
chemically filtering the air; and
filtering the air with one or more HEPA filters.

16. A method for purifying air for a nano-technology process environment, comprising the steps of:
providing air from an external air supply;
pre-treating the air at a pre-treatment unit;
compressing the air to a pressure such that water vapor and airborne contaminants form a condensate;
removing the condensate from the air;
post-treating the air at a post-treatment unit; and
directing the air into a tool environment within a clean room, while bypassing an air recirculation path of the clean room.

17. The method of claim 16, wherein the pre-treating step includes the steps of:
ionizing the air; and
adding moisture to the air with a humidifier.

18. The method of claim 17, wherein post-treating step includes the steps of:
filtering the air with a chemical filter; and
filtering the air with one or more HEPA filters.

19. The air filtration system of claim 1, wherein the first ventilation path is filtered separately from the third ventilation path.

20. The air filtration system of claim 1, wherein the second ventilation path, which is separate from the first ventilation path, is combined with the first ventilation path at a dry cooling coil unit.

21. The air filtration system of claim 1, wherein the third ventilation path is configured to direct air from the external air supply into the tool environment disposed within the clean room.

* * * * *